United States Patent
Nishizawa et al.

[19]

[11] Patent Number: 6,061,247
[45] Date of Patent: May 9, 2000

[54] MOTOR WITH ATTACHED CONTROL DEVICE

[75] Inventors: Takashi Nishizawa, Mie-ken; Motoyasu Mochizuki; Yoshinobu Nakamura, both of Aichi-ken; Youichi Morishima; Yasuo Hirano, both of Mie-ken, all of Japan

[73] Assignee: Kabushiki Kaisha Toshiba, Kawasaki, Japan

[21] Appl. No.: 09/048,851

[22] Filed: Mar. 27, 1998

[30] Foreign Application Priority Data

Mar. 27, 1997 [JP] Japan .................................. 9-075694

[51] Int. Cl.⁷ ...................................... H01G 9/04
[52] U.S. Cl. .................... 361/773; 310/68 R; 361/306.1; 439/620
[58] Field of Search .............................. 361/306.1, 760, 361/772, 773, 807, 809, 825; 310/71, 72, 68 R; 29/832; 439/620, 680, 616, 332, 335, 337, 338, 341

[56] References Cited

U.S. PATENT DOCUMENTS

| | | |
|---|---|---|
| 2,127,473 | 8/1938 | Sacco . |
| 3,185,954 | 5/1965 | Schade, Sr. . |
| 5,275,575 | 1/1994 | Cahaly . |
| 5,449,302 | 9/1995 | Yarbrough . |
| 5,641,310 | 6/1997 | Tiberio, Jr. . |

FOREIGN PATENT DOCUMENTS

| | | |
|---|---|---|
| 3163768 | 1/1990 | Japan . |
| 01174473 | 2/1991 | Japan . |
| 3278597 | 12/1991 | Japan . |

*Primary Examiner*—Gerald Tolin
*Attorney, Agent, or Firm*—Oblon, Spivak, McClelland, Maier & Neustadt, P.C.

[57] ABSTRACT

The present invention includes a motor body and provided to this motor body a motor with attached control device having a control device which drives this motor body, wherein the capacitor attached to the control device of this motor with attached control device is provided with a freely attachable and removable mounting device. According to the present invention, the attachment and removal of the capacitor of the control device which requires relatively frequent replacement can be performed freely, enabling the replacement to be performed simply.

11 Claims, 21 Drawing Sheets

MOTOR WITH ATTACHED CONTROL DEVICE

BACKGROUND OF THE INVENTION

1. Field of the Invention

The present invention relates to a motor with attached control device and more particularly to an improved attachment construction of the capacitor of the control device.

2. Description of the Related Art

Examples of this type of motor with attached control device include laid open utility model Sho 53-111206 of the Utility Model Gazette in which the control device is built into the terminal box.

FIG. 1 shows the conventional capacitor construction of the above mentioned control device which uses for example a power circuit smoothing capacitor. In the case of such devices, capacitor 1 is provided with connecting terminals 2, 3, then connecting terminals 2, 3 are inserted into holes 5, 6, formed in the control device of circuit board 4 and are attached and simultaneously connected by solder 7, 7 to the back side.

In the motor with the attached control device, circuit board 4 of the control device is installed in close proximity to the motor body. As a result, capacitor 1 attached to circuit board 4 is also located in close proximity to the motor body, whereby it receives heat generated from the motor body making it prone to deterioration and has a short life. Therefore, it is necessary to replace capacitor 1 of the control device relatively frequently.

However, as mentioned above, as capacitor 1 is attached by solder to circuit board 4, removal can not be performed simply, in addition, following removal, a new capacitor 1 can also not be replaced simply. There is therefore a problem regarding the difficulty of replacing capacitor 1.

SUMMARY OF THE INVENTION

Accordingly, one object of the invention is to provide a novel motor with attached control device wherein the capacitor of the control device can be replaced simply.

To achieve the above stated purpose, the motor with attached control device has the special characteristic of having a control device which controls the drive installed in the motor body wherein the capacitor of the control device is provided with a freely attaching and removing mounting device.

According to the present invention, the capacitor of the control device can be attached and replaced freely from the mounting device, thereby enabling the replacement of the capacitor to be carried out simply.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
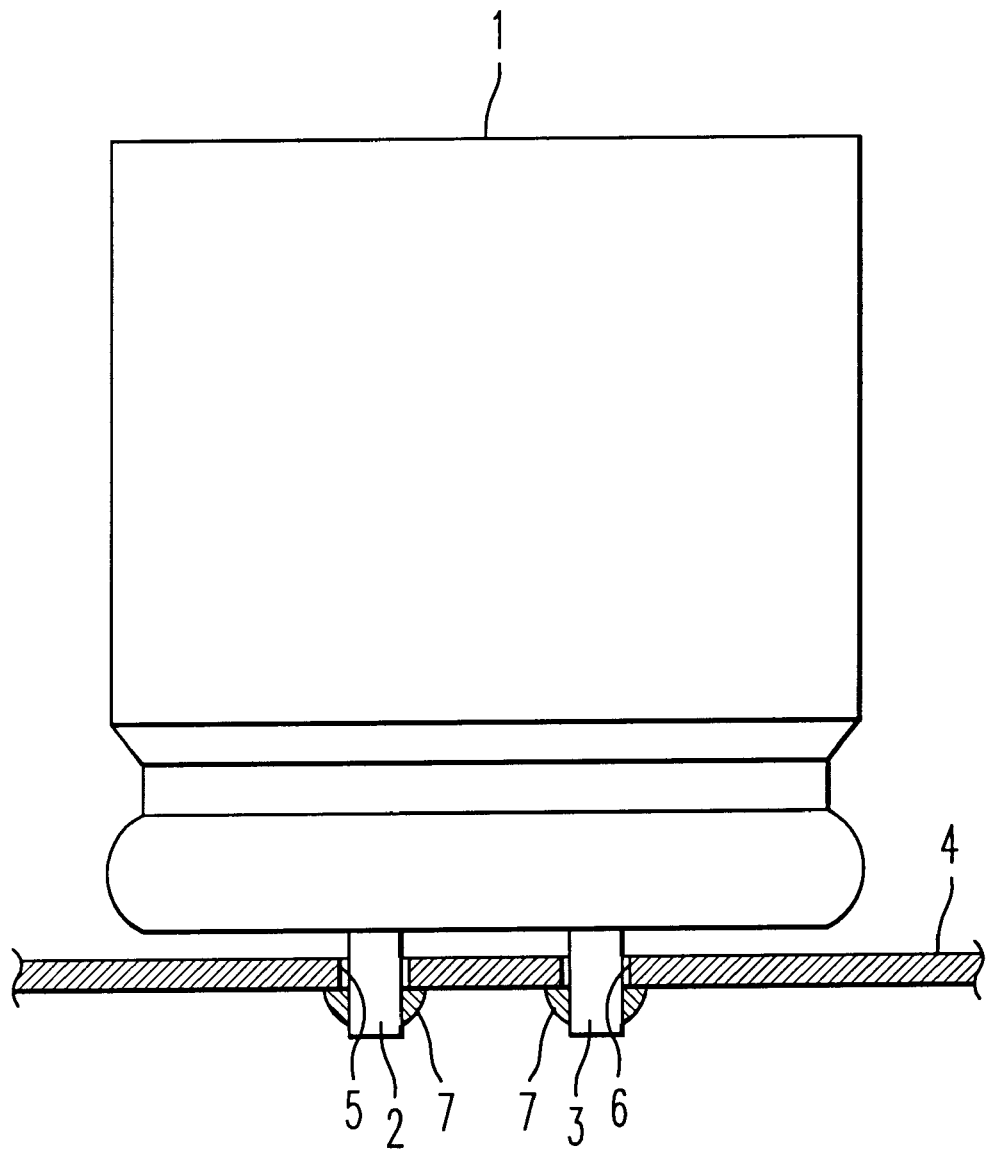
FIG. 1 is a plan view showing the main parts of a conventional example.

Referring now to the drawings, wherein like reference numerals designate identical or corresponding parts throughout the several views, and more particularly to FIGS. 2–6 thereof, one embodiment of the present invention will be described.

Figure 3:
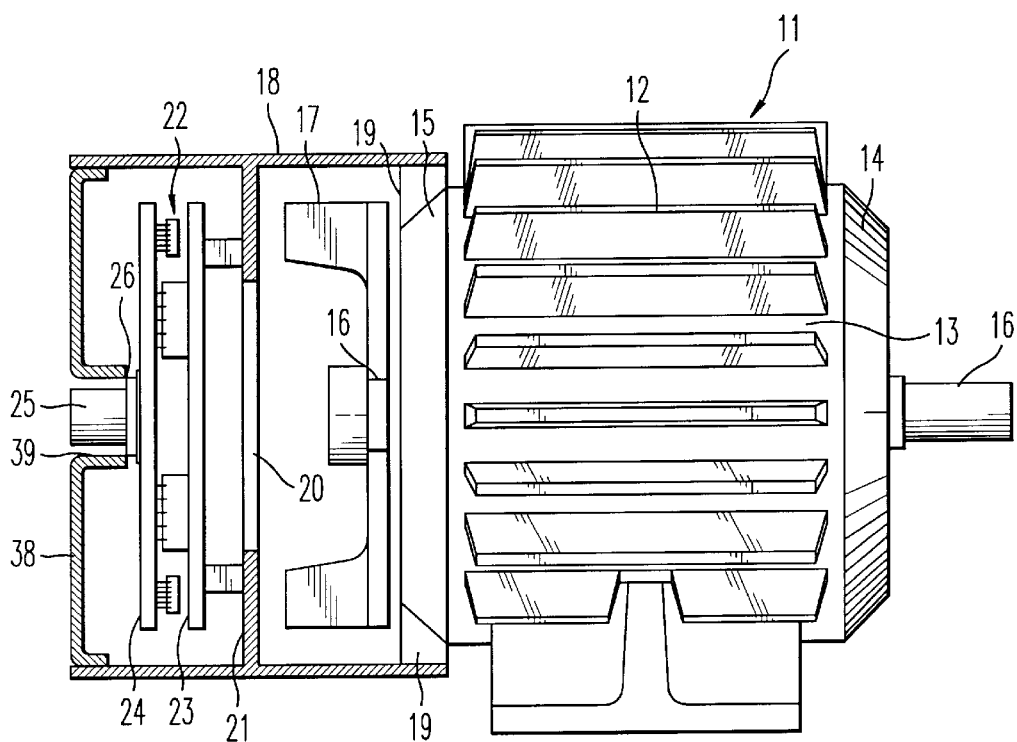
FIG. 3 is a side view of the whole motor showing a cross section of the control device part.

Firstly, FIG. 3 shows motor body 11, having frame 13 provided with multiple radiation fins 12 on its peripheral part and provided with stators and rotors (rotators) internally not shown in the drawing, and having brackets 14, 15 connected to both axial end parts of frame 13, from one side of bracket 14 (center right of the drawing) the end part of rotation shaft protrudes and from the other bracket 15 (center left of the drawing) the other end part of rotation shaft 16 protrudes.

Cooling fan 17 is attached to the other end part of the aforesaid rotation shaft 16, fan cover 18 is provided covering cooling fan 17 and connected to the aforesaid other end of bracket 15 by connecting rib 19. Here, cooling fan 17 and fan cover 18 function to send cold wind towards motor body 11.

Meanwhile, control device 22 is provided and housed in the part on the opposite side of motor body 11, wherein vent opening 20 is partitioned by partition 21 in regard to the part housing aforesaid cooling fan 17 of fan cover 18. This control device is comprised, for example, of an inverter device and although not shown in detail in the drawing, consists of a power circuit part which receives an alternating current input and outputs a direct current and a switching circuit part which switches the direct current from the power circuit part and a control circuit part which controls the drive (revolution speed control) of motor body 11.

Figure 4:
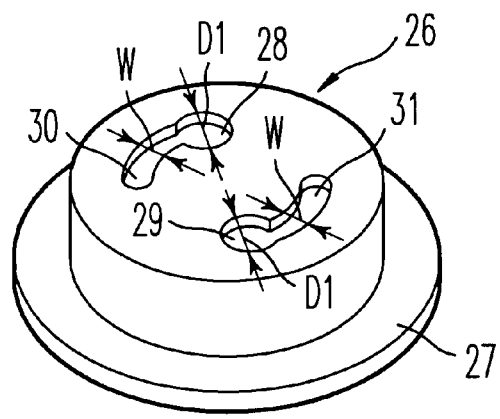
FIG. 4 is an oblique view of the mounting device.

Each circuit part of the above mentioned control part 22 is provided on circuit board 23, 24, of these, the power circuit part is provided on outside (center left of the diagram) circuit board 24. Therefore, in the center part of the back side (outside) of the outside of circuit board 24, mounting device 26 is provided for attaching, for example, the smoothing capacitor of the power circuit part. Mounting device 26, as shown in FIG. 4 consists of a flattened cylindrical shaped cap surrounded by flange part 27, and is attached to the center part of the rear side of the aforesaid circuit board 24 by flange part 27, on the apex, equidistant from the center point in a symmetrical configuration is formed holes 28, 29. Elongated holes 30, 31 are also formed from the holes 28, 29, each extending in an arc shape centered on the central part of the apex for example in an counter-clockwise direction through exactly the length of a 90° angle. Furthermore, each width W of elongated hole 30, 31 is formed smaller than each diameter D1 of hole 28, 29.

Figure 5:
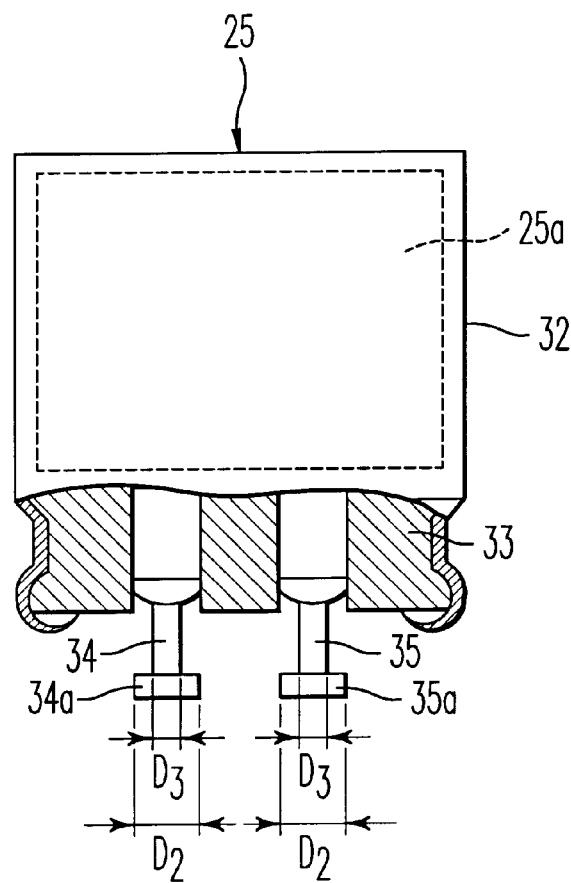
FIG. 5 is a broken plan view of the capacitor attached to the control device.

In regard to this, capacitor 25, as for example shown in FIG. 5, houses capacitor element 25a impregnated with battery electrolyte from the opening part of aluminum armored case 32, as shown in the lower center of the drawing, wherein the opening part comprises an electrolytic capacitor sealed by rubber sealing body 33, and connecting terminals 34, 35 protrude from sealing body 33.

Figure 6:
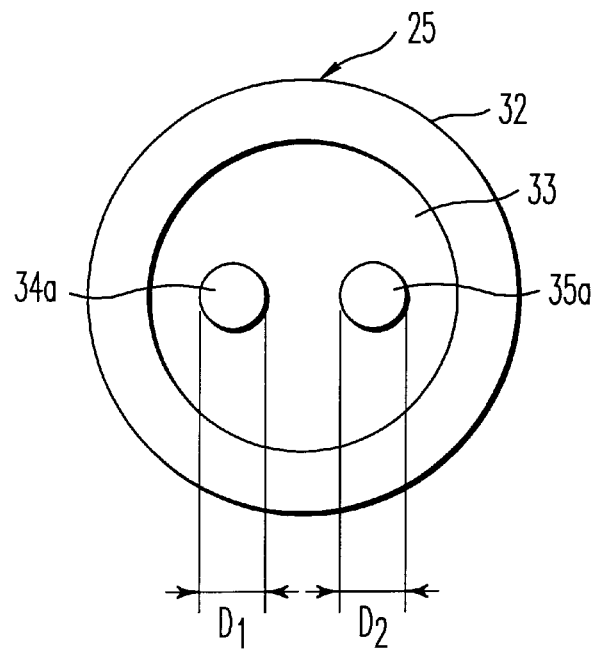
FIG. 6 is a back view of the capacitor attached to the control device.
Figure 7:
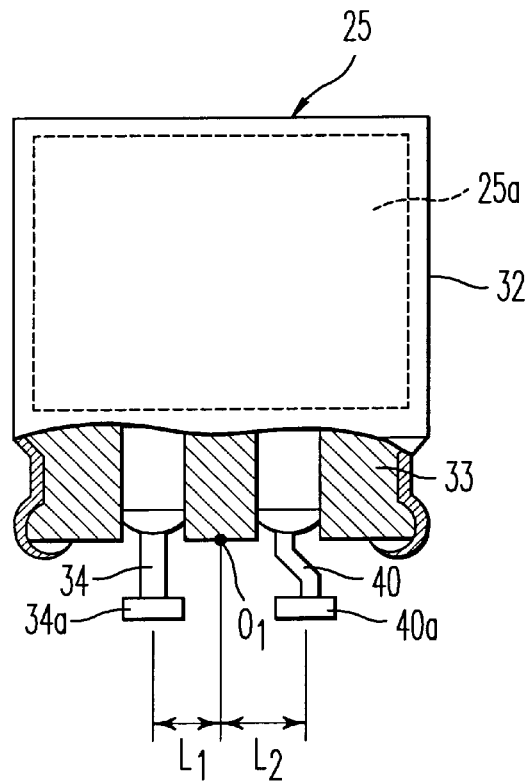
FIG. 7 is a broken plan view of the capacitor as shown as the second embodiment of the present invention.
Figure 8:
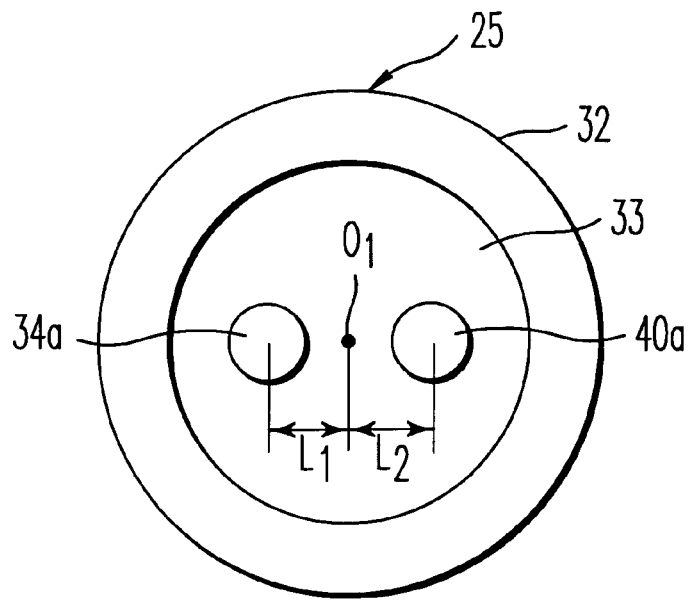
FIG. 8 is a back view of the capacitor as shown as the second embodiment of the present invention.
Figure 9:
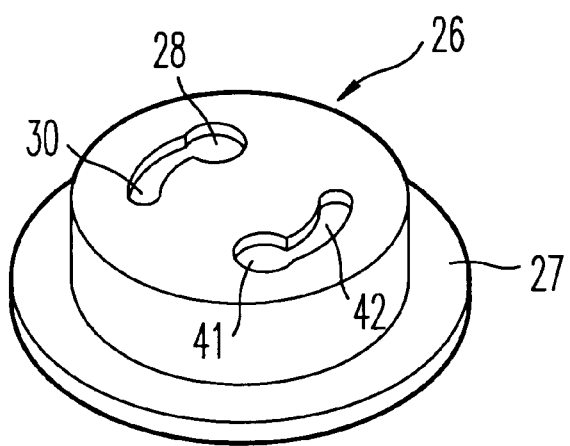
FIG. 9 is an oblique view of the mounting device as shown as the second embodiment of the present invention.
Figure 10:
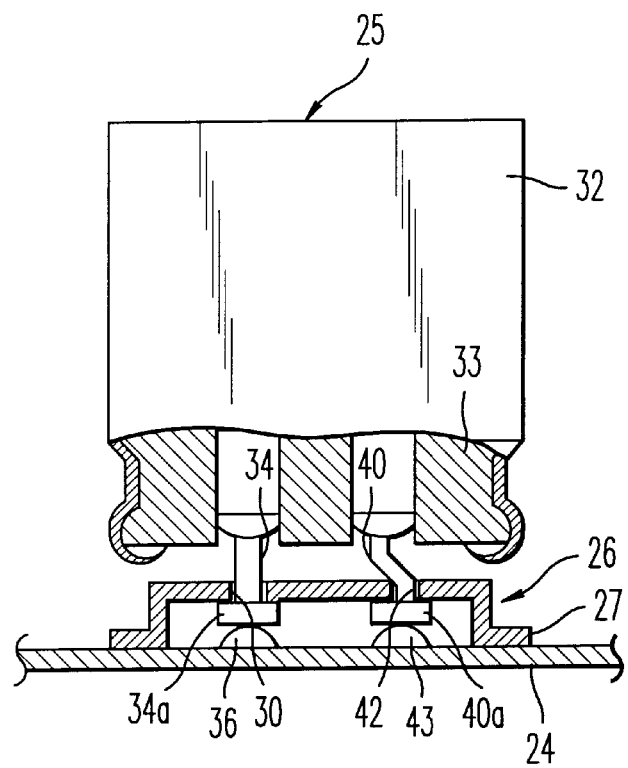
FIG. 10 is a broken plan view of the main parts as shown as the second embodiment of the present invention.
Figure 11:
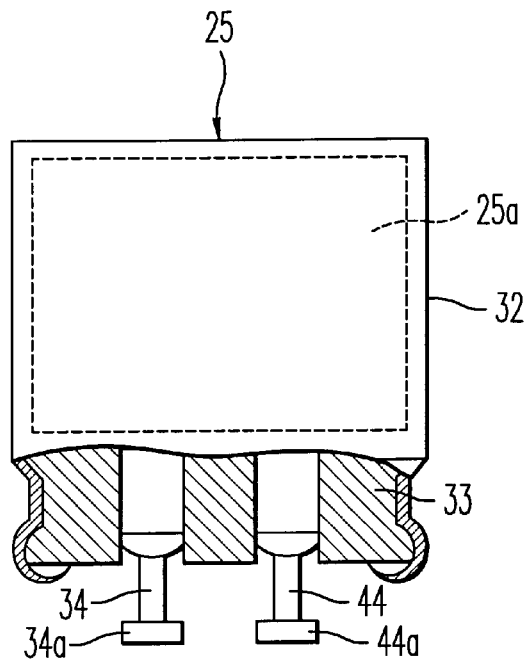
FIG. 11 is a broken plan view of the capacitor attached to the control device as shown as the third embodiment of the present invention.
Figure 12:
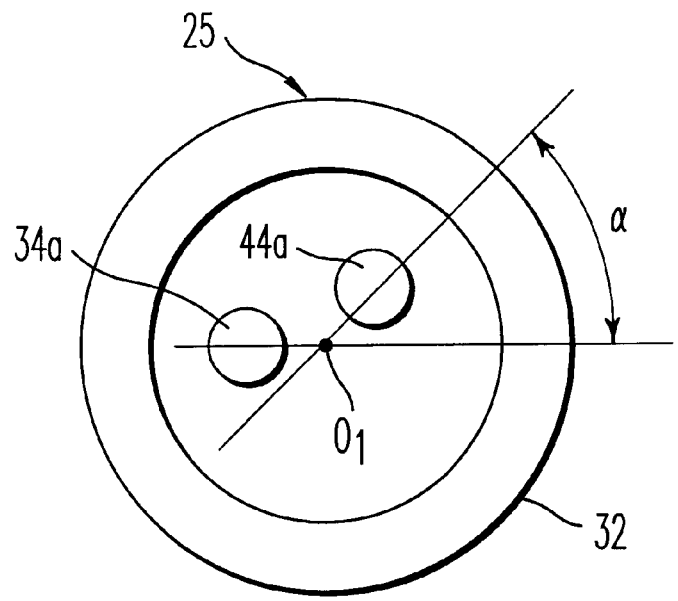
FIG. 12 is a back view of the capacitor attached to the control device.
Figure 13:
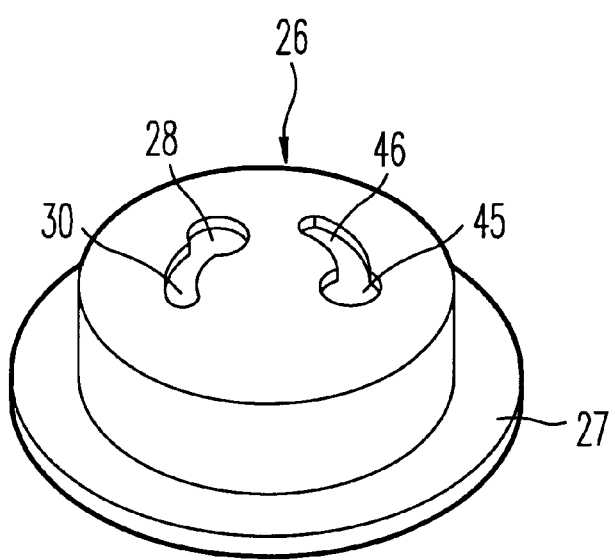
FIG. 13 is an oblique view of the mounting device.
Figure 14:
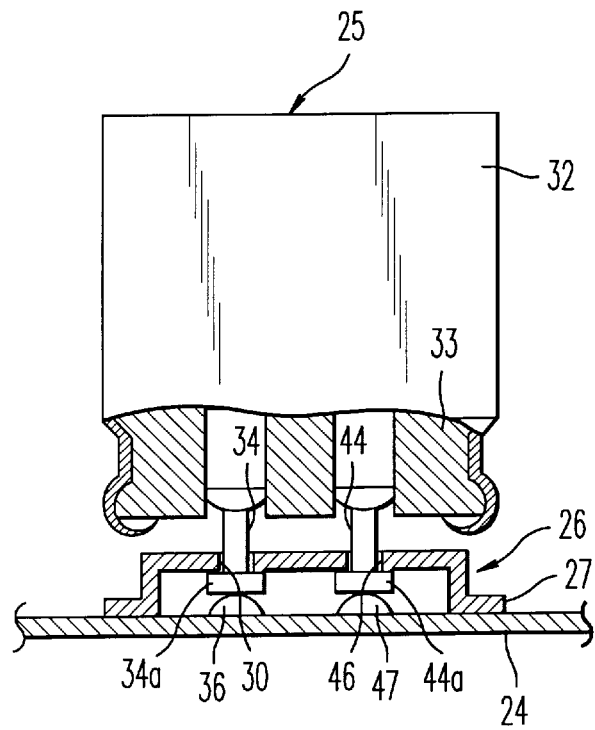
FIG. 14 is a broken plan view of the main parts as shown as the third embodiment of the present invention.

Also, each end part of the aforesaid connecting terminal 34, 35, as shown in FIG. 6, forms diametrical flange part 34a, 35a, wherein the diameter D2 of each flange part 34a, 35a is a little bit smaller than the diameter D1 of each of the aforesaid holes 28, 29 of mounting device 26, however, provided larger than each width W of elongated holes 30, 31 and where diameter D3 of the actual connecting terminal 34, 35 is provided smaller than each width W of elongated hole 30, 31.

Figure 2:
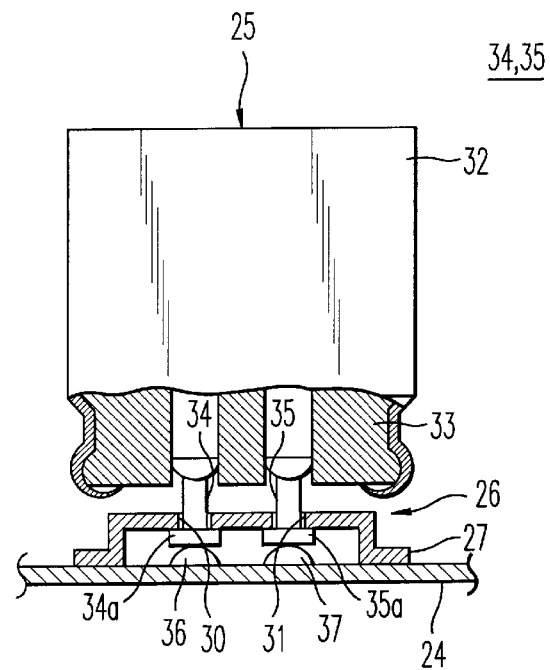
FIG. 2 is a broken plan view of the main parts of the first embodiment of the present invention.

With this construction, to attach capacitor 25, flange part 34a, 35a is inserted into hole 28, 29 of mounting device 26, after which capacitor 25 is turned in this case in a counter-clockwise direction. By doing so, connecting terminal 34, 35 advances parallel to elongated hole 30, 31 of mounting device 26 and at each of the inner parts as shown in FIG. 2, flange part 34a, 35a press fits between contact point 36, 37 provided on the back side of circuit board 24 and mounting device 26. In this way, it is possible to attach capacitor 25 to circuit board 24 via mounting device 26, and when mounted accordingly, flange part 34a, 35a of connecting terminal 34, 35 makes contact with contact point 36, 37 and connects with the aforesaid power circuit part.

Furthermore, in this case, as capacitor 25 is an electrolytic capacitor, one of either of connecting terminals 34, 35 is an anode and the remaining other a cathode. Therefore, as one of the contact points 36, 37 of circuit board 24 is an anode while the remaining other a cathode, it is therefore necessary to align the polarity when attaching.

Also, the reverse of the above mentioned procedure is performed when removing attached capacitor 25. Furthermore, protective cover 38 as shown in FIG. 3 is mounted on the extreme outside part of aforesaid fan cover 18, and protective cover 38 contains hole part 39 the location of which exposes capacitor 25 when capacitor 25 is in an attached condition, thereby enabling the aforesaid attachment and removal of capacitor 25 from outside of protective cover 38.

By the present construction, capacitor 25 can be attached to mounting device 26 by means of the simple operation of inserting and revolving connecting terminals 34, 35. Removal is performed by the simple operation of revolving said connecting terminals in the opposite direction and pulling out, thereby enabling capacitor 25 to be attached and removed freely. In this way, the replacement of capacitor 25 can be performed simply, and conforms to the special conditions of a motor with attached control device, wherein it is desirable for capacitor 25 to be replaced simply as due to the close proximity of capacitor 25 to motor body 11, the aforementioned capacitor receives heat generated by motor body 11 making it prone to deterioration and reducing its life, thereby necessitating relatively frequent replacement.

Regarding the aforesaid, as FIG. 7 through FIG. 10 shows the second embodiment of the present invention, mention will only be made of parts differing from the first embodiment. In the case of this embodiment, in relation to one of the connecting terminals, connecting terminal 34 of capacitor 25, the other connecting terminal, connecting terminal 40 is provided so that it is bent outwards, whereby the distance L1, L2 from the center part O1 of capacitor 25 to the central part of flange part 34a, 40a of each of the end parts of connecting terminal 34, 40 is different. Also, to correspond to this, the position of each of holes 28, 41 of mounting device 26, and elongated hole 30, 42 and connecting point 36, 43 of circuit board 24 have also been accordingly altered.

By doing this, if an error with the polarity alignment is made when attempting to attach capacitor 25, at the point of inserting capacitor into hole part 39 of protective cover 38, connecting terminal 34, 40 will not enter hole 28, 41 of mounting device 26. Also, even without protective cover 38, by making capacitor 25 eccentric to (out of line with) mounting device 26, the error in polarity alignment will soon be made apparent. In this way, errors in polarity alignment when attaching capacitor 25 can be prevented, this also may be said to meet the special conditions of a motor with attached control device wherein there are concerns regarding errors in polarity alignment when attaching capacitor 25 due to the necessity of replacing the aforementioned capacitor on a relatively frequent basis.

As FIG. 11 through FIG. 14 show the third embodiment of the present invention, mention will only be made of parts differing from the first embodiment.

In the case of this embodiment, in relation to one of the connecting terminals, connecting terminal 34 of capacitor 25, by shifting the position of the other connecting terminal, connecting terminal 44 in the revolving direction of capacitor 25, the line joining connecting terminal 34 and the center part O1 of the capacitor 25 is provided so that the line joining the other connecting terminal, connecting terminal 44 and the center part O1 of capacitor 25 intersects at predetermined angle α. Also, to correspond to this, the position of hole 28, 45 of mounting device 26 and elongated hole 30, 46 and connecting point 36, 47 of circuit board 24 have been accordingly altered.

Even by doing this, if an error in polarity alignment is made when attempting to attach capacitor 25, at the point of inserting capacitor 25 into hole part 39 of protective cover 38, connecting terminals 34, 44 will not enter holes 28, 45 of mounting device 26. Also, even without protective cover 38, by making capacitor 25 eccentric to (out of line with) mounting device 26, the error in polarity alignment will soon be made apparent. In this way, errors in polarity alignment when attaching capacitor 25 can be prevented, this is may also be said to meet the special conditions of a motor with attached control device wherein there are concerns regarding errors in polarity alignment when attaching capacitor 25 due to the necessity of replacing the aforementioned capacitor on a relatively frequent basis.

Figure 15:
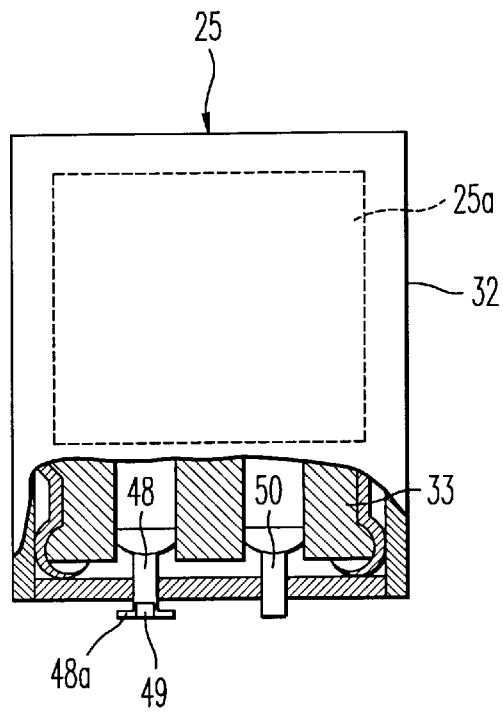
FIG. 15 is a broken plan view of the capacitor attached to the control device as shown as the fourth embodiment of the present invention.
Figure 16:
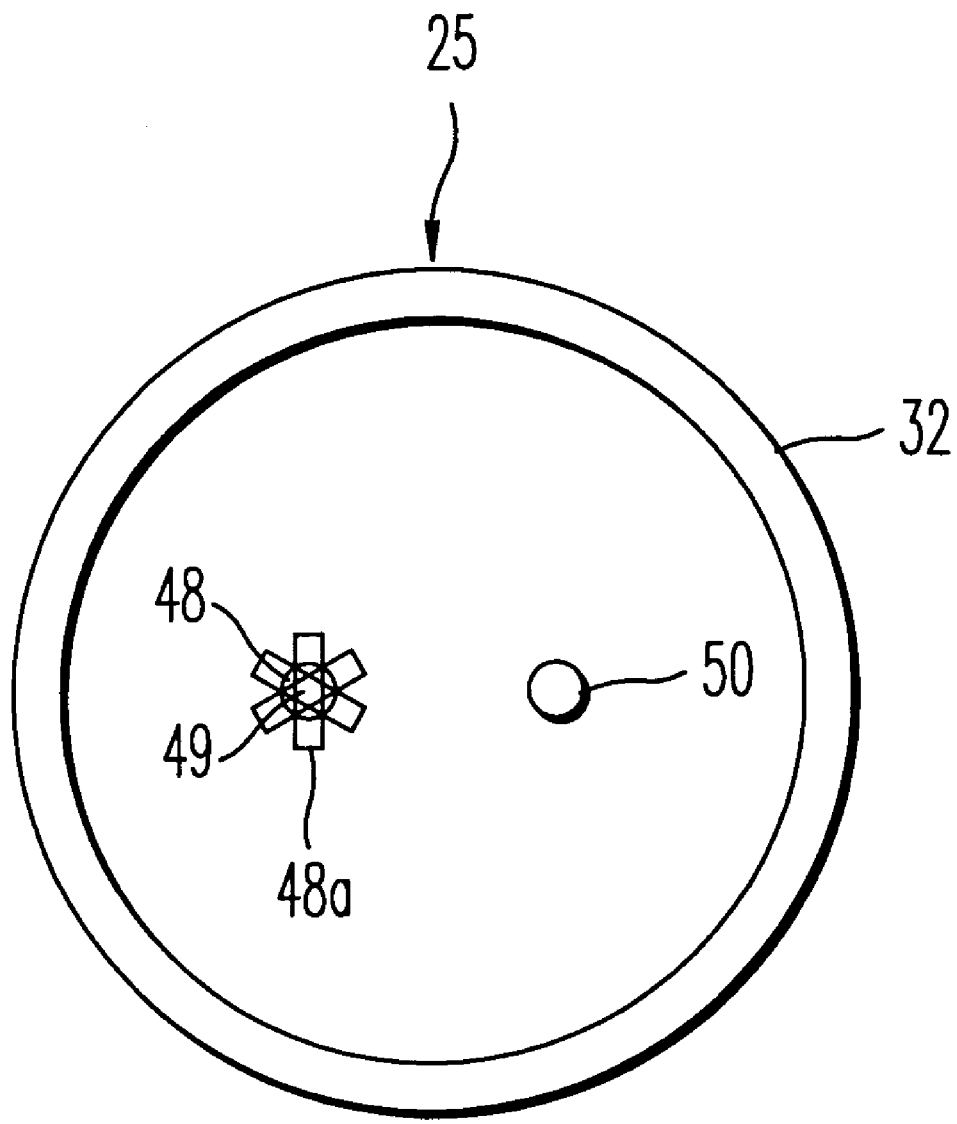
FIG. 16 is a back view of the capacitor attached to the control device.

As FIG. 15 and FIG. 16 show fourth embodiments of the present invention, mention will only be made of parts differing from first embodiment.

In the case of this embodiment, the end part of one of the connecting terminals, connecting terminal 48 of capacitor 25 is concave, formed by indentation 49, the other connecting terminal, connecting terminal 50 protrudes unchanged.

Also, regarding connecting terminal 48, 50 of capacitor 25, the mounting device (not shown on the diagram) is provided with a plug-in receptor (also not shown on diagram) whereby capacitor 25 can be attached and connected simply by inserting (plugging in) and fitting aforesaid connecting terminals, this plug-in receptor is provided with a convex-concave configuration to match the concave-convex configuration of connecting terminals 48,50.

By doing this, capacitor 25 can be attached by the simple operation of simply inserting the aforementioned capacitor, and as it can be removed from this condition by the simple operation of pulling it out, in this case also, the free attachment and removal of capacitor 25 enables capacitor 25 to be removed simply.

Also, in this case, if an error is made in the polarity alignment when attempting to attach capacitor 25, the concave-convex configuration of connecting terminal 48,50 will not match the convex-concave configuration of the plug in receiver and connecting terminal 48,50 will be unable to be inserted correctly into the plug in receiver. In this way, errors in polarity alignment when attaching capacitor 25 can be prevented, this may also be said to meet the special conditions of a motor with attached control device, wherein there are concerns regarding errors in polarity alignment when attaching capacitor 25 due to the necessity of replacing the aforementioned capacitor on a relatively frequent basis.

Furthermore, overhang part 48a is provided on the end part of one of the connecting terminals, connecting terminal 48 of capacitor 25 to prevent this connecting terminal 48 from being inserted into the matching convex part of the plug in receptor part corresponding to the other connecting terminal connecting terminal 49.

Figure 17:
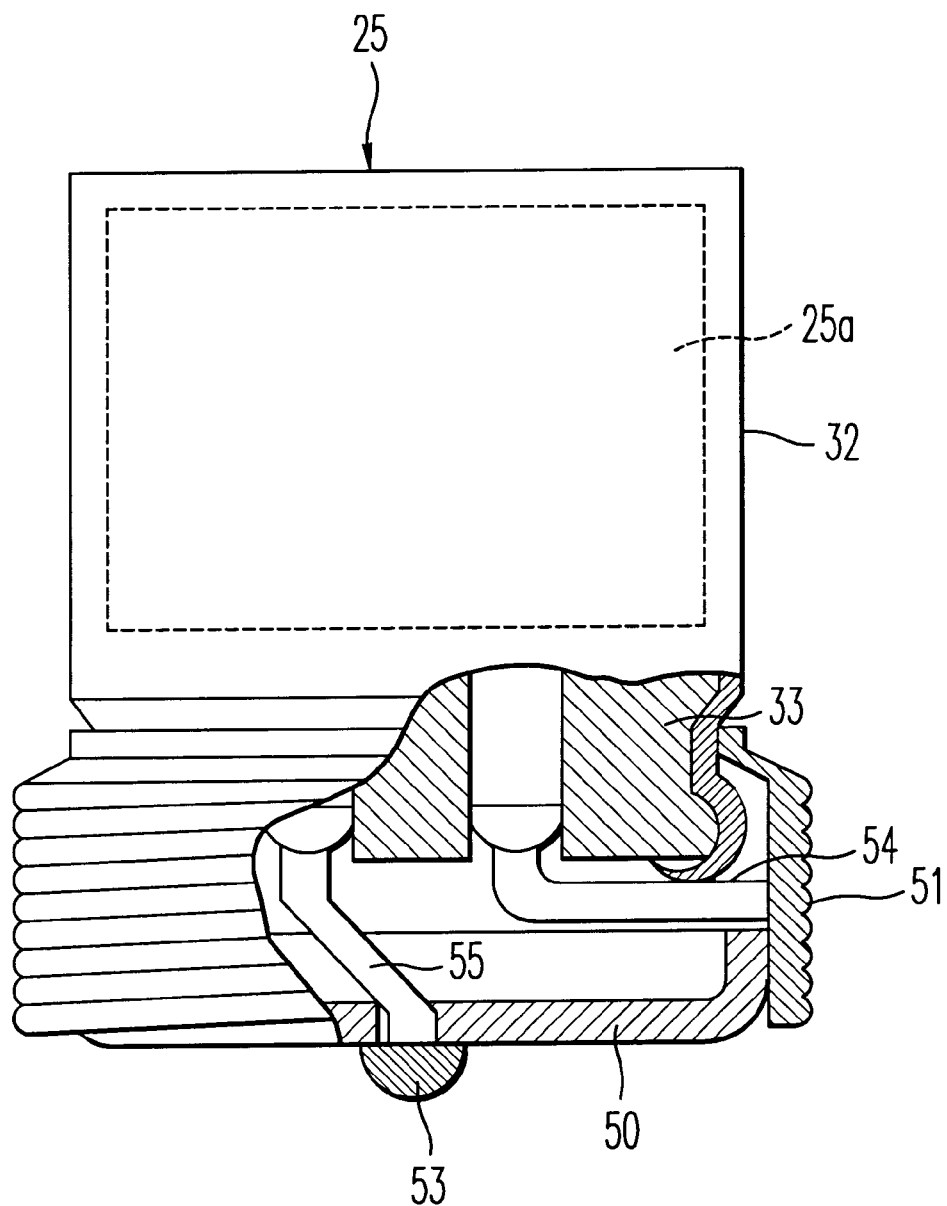
FIG. 17 is an enlarged broken plan view of the capacitor attached to the control device as shown as the fifth embodiment of the present invention.

As FIG. 17 shows the fifth embodiment of the present invention, mention will only be made of parts differing from the first embodiment.

In the case of this embodiment, one of the connecting terminals, connecting terminal 54 and the other connecting terminal connecting terminal 55 of capacitor 25 is connected by screw cap base 51 provided to the peripheral part of the attachment part of capacitor 25 and connecting node 53 provided via insulating material 52 to the central part of the inner part.

Also, corresponding to screw cap base 51 and connecting node 53 of capacitor 25, a screw cap (socket) which screws into screw cap base 51 and a connection point (not shown on the diagram) connecting capacitor 25 as a result of this screwing action is provided on the mounting device (also not shown on the diagram).

With this construction, as capacitor 25 can be attached by the simple operation of rotating (screwing) said capacitor in, for example, a clockwise direction and, from this condition, can be removed by the simple operation of rotating in the opposite direction, in this case also, the free attachment and removal of capacitor enables capacitor 25 to be replaced simply. Also, in this case errors in polarity alignment can be prevented when attaching capacitor 25.

Figure 18:
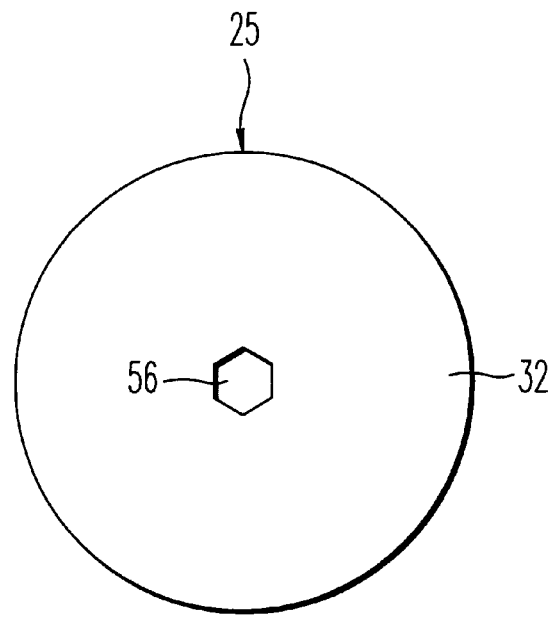
FIG. 18 is a front view of the capacitor attached to the control device as shown as the sixth embodiment of the present invention.
Figure 19:
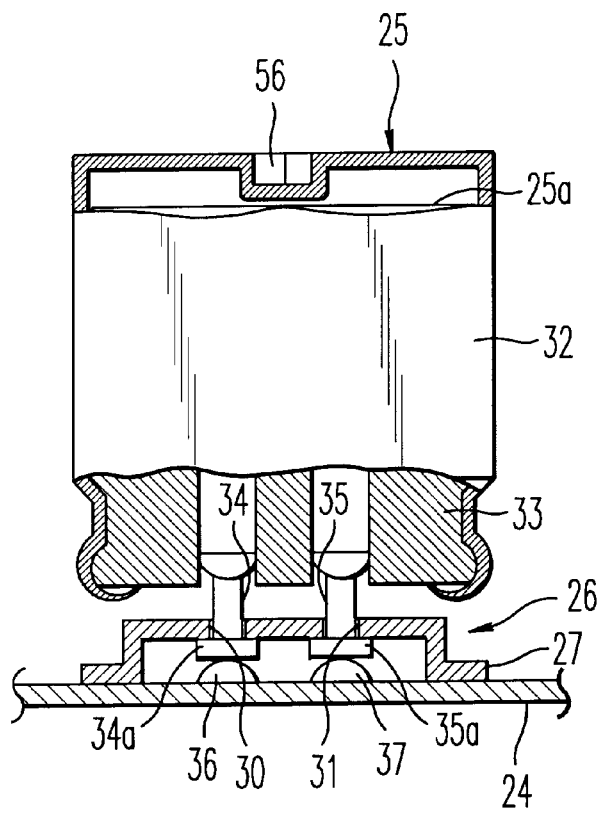
FIG. 19 is a broken plan view of the main parts as shown as the sixth embodiment of the present invention.

As FIG. 18 and FIG. 19 show the sixth embodiment of the present invention, mention will only be made of parts differing from first embodiment.

In the case of this embodiment, hexagonal hole 56 is formed directly in armored case 32 on the apex of capacitor 25.

With this construction, the rotating operation when attaching and removing capacitor 25 can be carried out simply and with certainty by the insertion and rotation of a hexagonal wrench.

Figure 20:
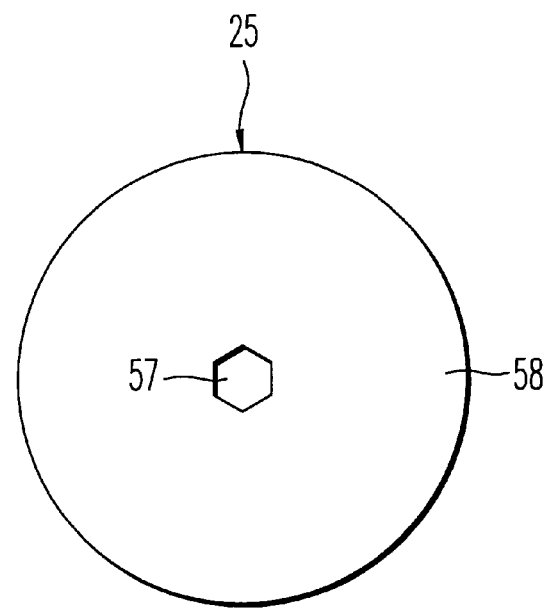
FIG. 20 is a front view of the capacitor attached to the control device as shown as the seventh embodiment of the present invention.
Figure 21:
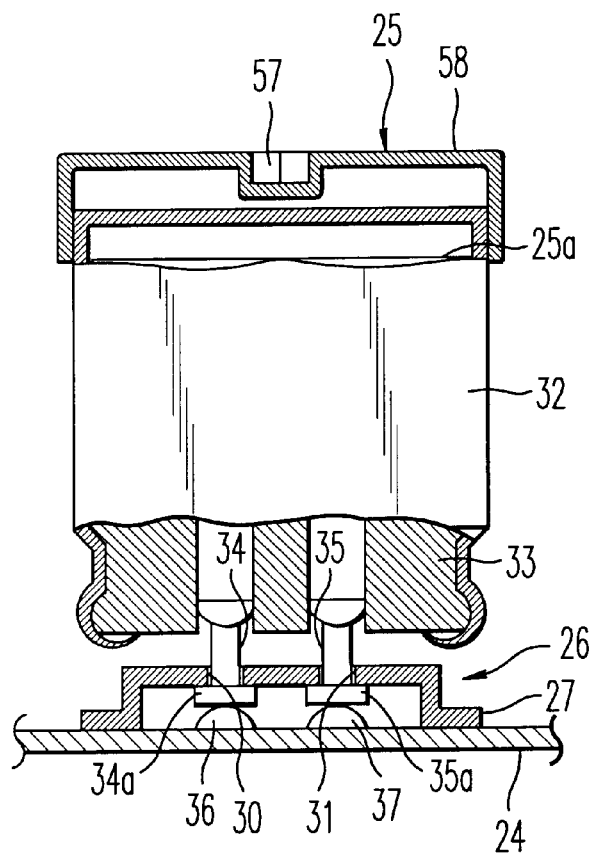
FIG. 21 is a broken plan view of the main parts as shown as the seventh embodiment of the present invention.

As FIG. 20 and FIG. 21 show the seventh embodiment of the present invention, mention will only be made of parts differing from the first embodiment.

In the case of this embodiment, hexagonal hole 57 is formed in top cover 58 affixed to armored case 32 provided on the top part of capacitor 25.

With this construction, the rotation operation when attaching and removing capacitor 25 can be carried out simply and with certainty by the insertion and turning of a hexagonal wrench.

Figure 22:
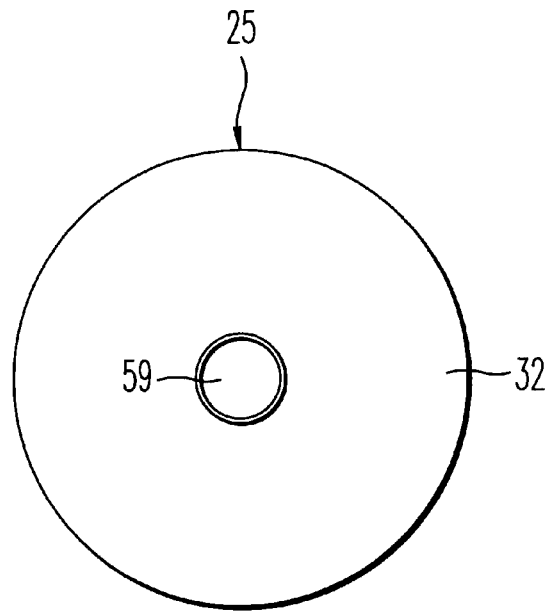
FIG. 22 is a front view of the capacitor attached to the control device as shown as the eighth embodiment of the present invention.
Figure 23:
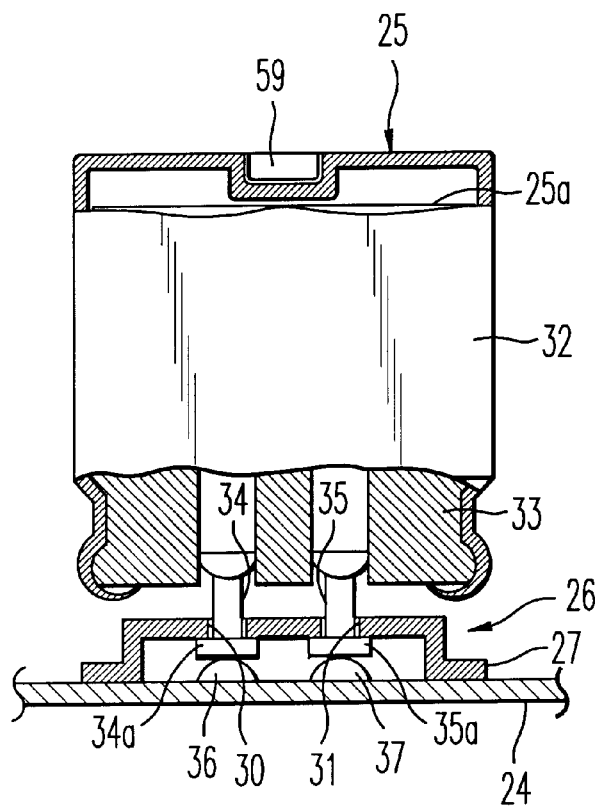
FIG. 23 is a broken plan view of the main parts as shown as the eighth embodiment of the present invention.

As FIG. 22 and FIG. 23 show the eighth embodiment of the present invention, mention will only be made of parts differing from the first embodiment.

In the case of this embodiment, screw hole 59 is formed directly in armored case 32 provided on the apex of capacitor 25.

With this construction, the lifting operation when removing capacitor 25 can be performed simply and with certainty by lifting any kind of screw screwed into screw hole 59.

Figure 24:
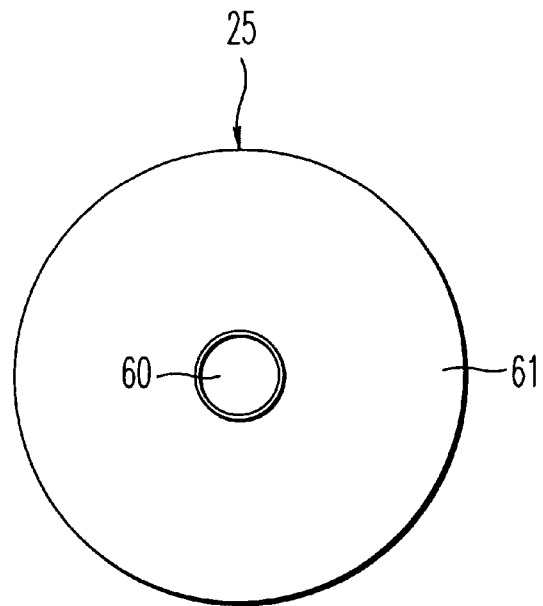
FIG. 24 is a front view of the capacitor attached to the control device as shown as the ninth embodiment of the present invention.
Figure 25:
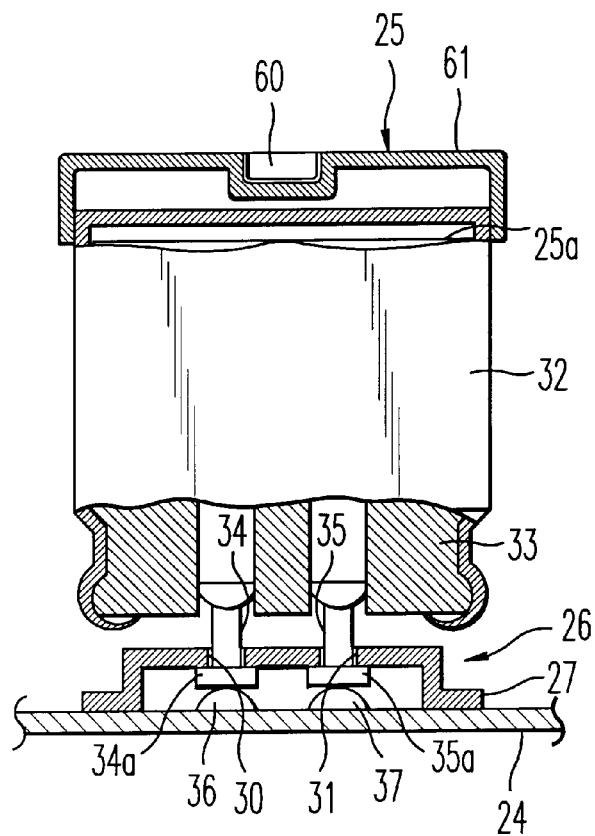
FIG. 25 is a broken plan view of the main parts as shown as the ninth embodiment of the present invention.

As FIG. 24 and FIG. 25 show the ninth embodiment of the present invention, mention will only be made of parts differing from the first embodiment.

In the case of this embodiment, screw hole 60 is formed on top cover 61 affixed to armored case 32 provided on the apex of capacitor 25.

Even with this construction, the lifting operation when removing capacitor 25 can be performed simply and with certainty by lifting any type of screw screwed into screw hole 60.

Figure 26:
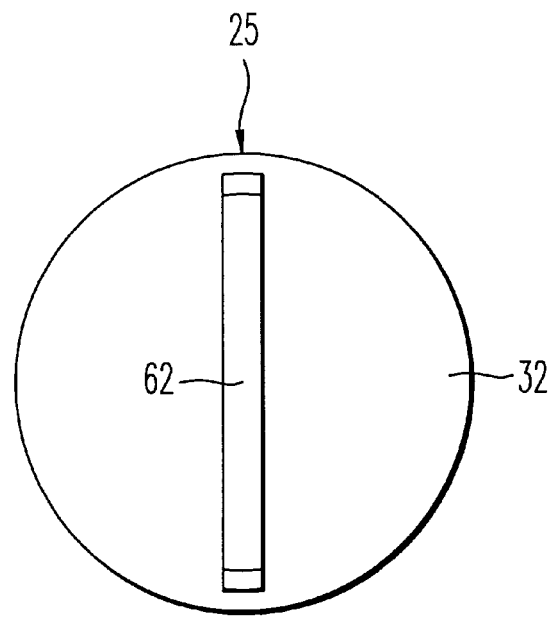
FIG. 26 is a front view of the capacitor attached to the control device as shown as the tenth embodiment of the present invention.
Figure 27:
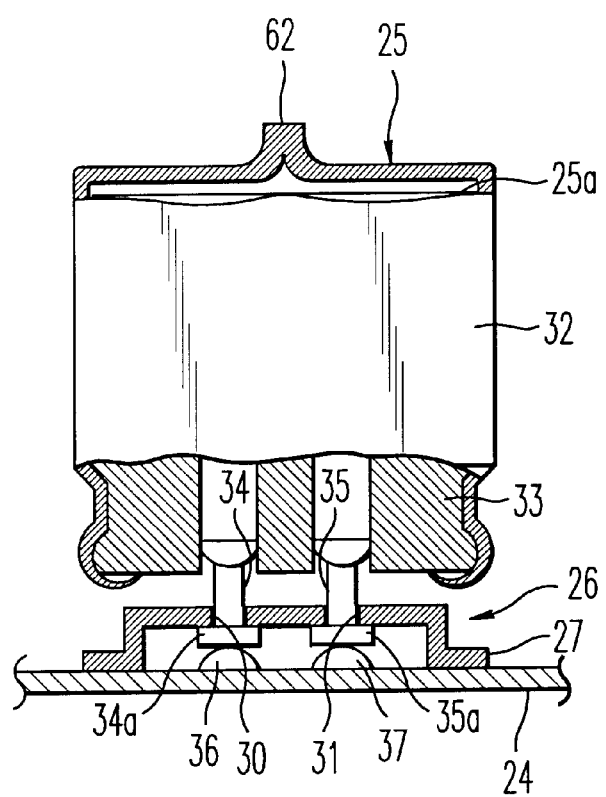
FIG. 27 is a broken plan view of the main parts as shown as the tenth embodiment of the present invention.

As FIG. 26 and FIG. 27 show the tenth embodiment of the present invention, mention will only be made of parts differing from the first embodiment.

In the case of this embodiment, protruding part 62 is formed directly in armored case 32 provided on the apex of capacitor 25.

By doing this, the rotation operation when attaching and removing capacitor 25 can be performed simply and with certainty by pinching protruding part 62 and rotating.

Figure 28:
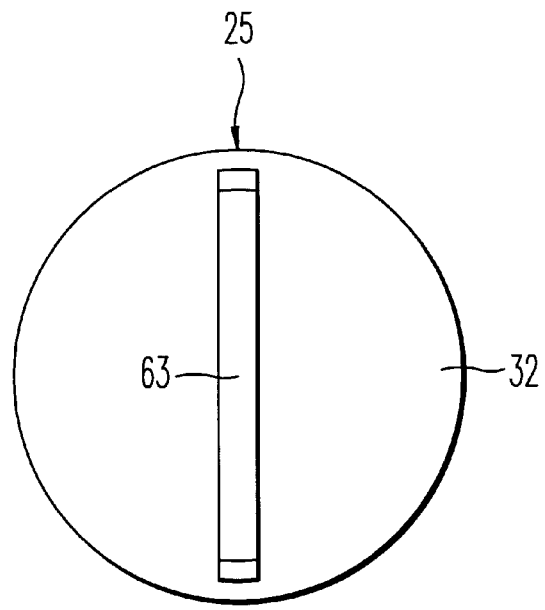
FIG. 28 is a front view of the capacitor attached to the control device as shown as the eleventh embodiment of the present invention.
Figure 29:
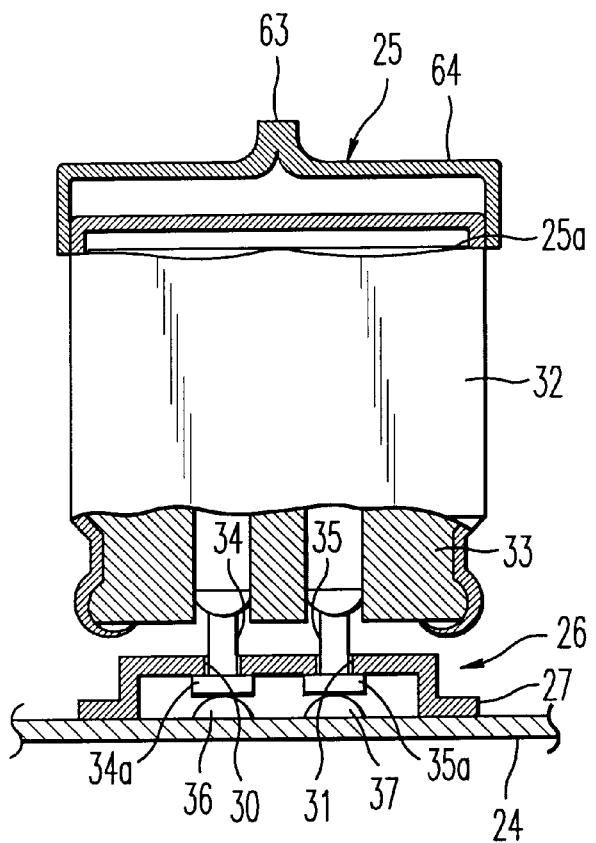
FIG. 29 is a broken plan view of the main parts as shown as the eleventh embodiment of the present invention.

As FIG. 28 and FIG. 29 show the eleventh embodiment of the present invention, mention will only be made of parts differing from the first embodiment.

In the case of this embodiment, protruding part 63 is formed on top cover 64 affixed to armored case 32 provided on the apex of capacitor 25.

Even with this construction, the rotation operation when attaching and removing capacitor 25 can be performed simply and with certainty by pinching protruding part 63 and rotating.

Figure 30:
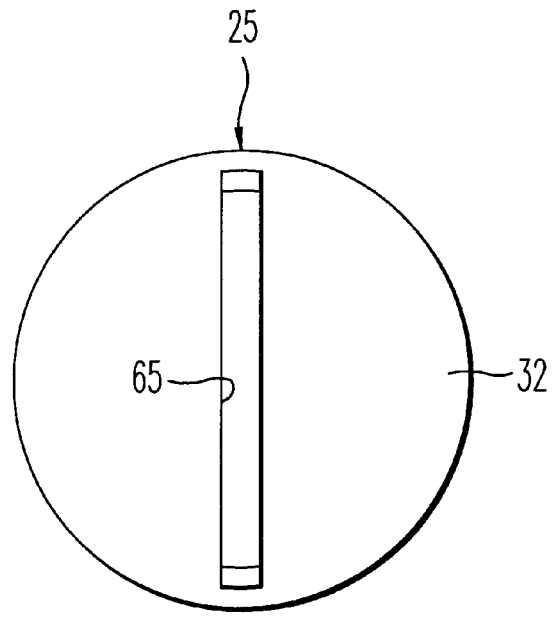
FIG. 30 is a front view of the capacitor attached to the control device as shown as the twelfth embodiment of the present invention.
Figure 31:
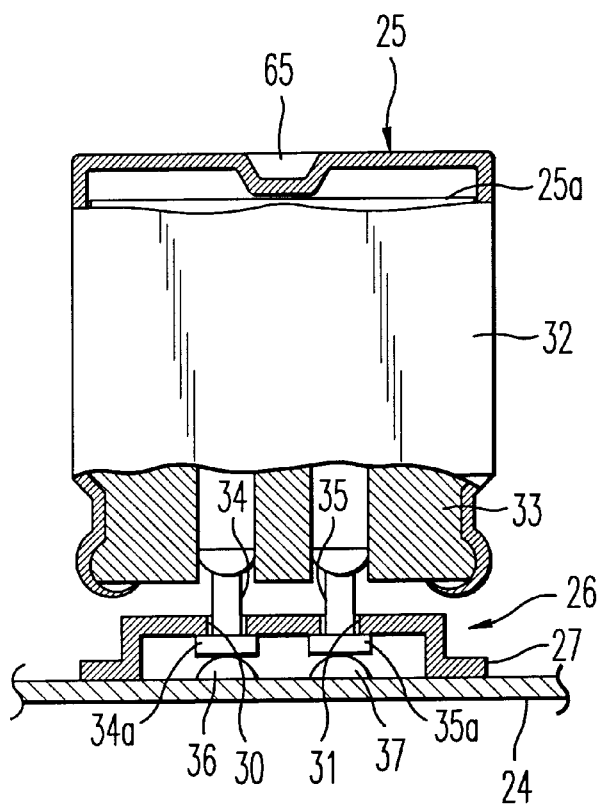
FIG. 31 is a broken plan view of the main parts as shown as embodiment twelfth of the present invention.

As FIG. 30 and FIG. 31 show the twelfth embodiment of the present invention, mention will only be made of parts differing from the first embodiment.

In the case of this embodiment, grooved part 65 is formed directly into armored case 32 provided on the apex of capacitor 25.

With this construction, the rotation operation when attaching and removing capacitor 25 can be performed simply and with certainty by inserting a coin into groove part 65 and rotating.

Figure 32:
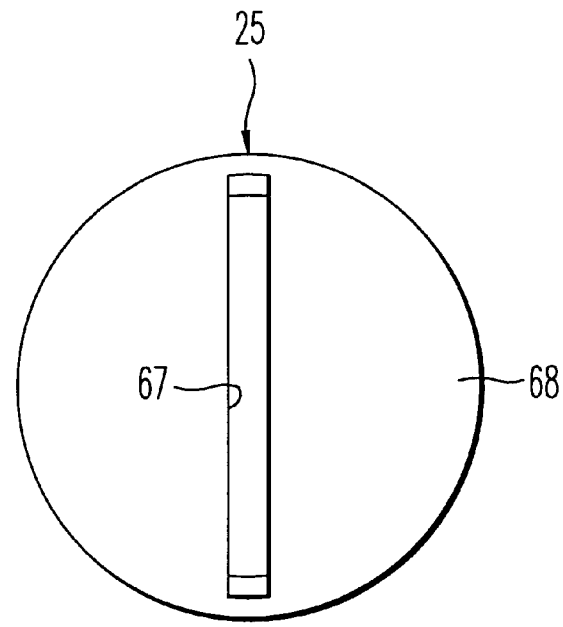
FIG. 32 is a front view of the capacitor attached to the control device as shown as the thirteenth embodiment of the present invention.
Figure 33:
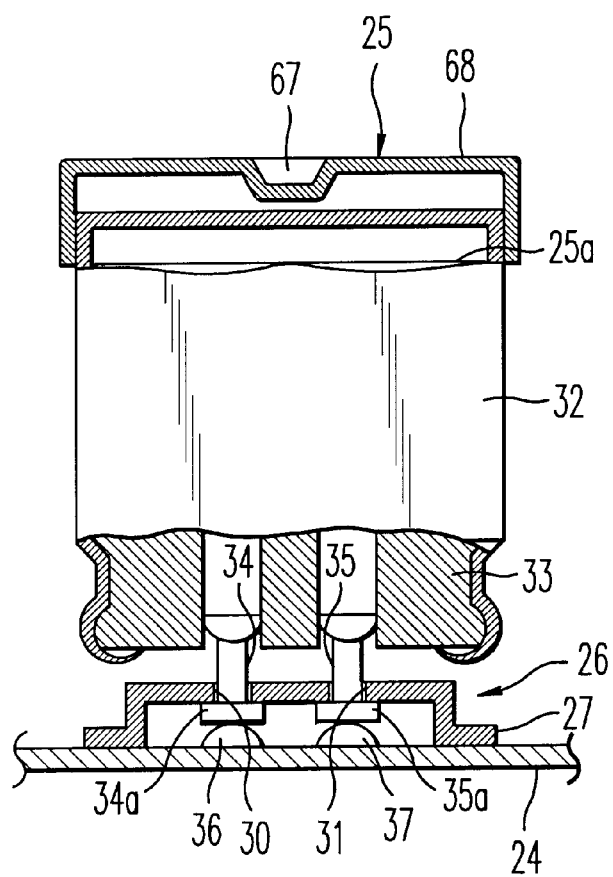
FIG. 33 is a broken plan view of the main parts as shown as the thirteenth embodiment of the present invention.

As FIG. 32 and FIG. 33 show the thirteenth embodiment of the present invention, mention will only be made of parts differing from the first embodiment.

In the case of this embodiment, grooved part 67 is formed directly on top cover 68 affixed to armored case 32 provided on the apex of capacitor 25.

Even with this construction, the rotation operation when removing and replacing capacitor 25 can be performed simply and with certainty by inserting a coin into groove part 67 and rotating.

Figure 34:
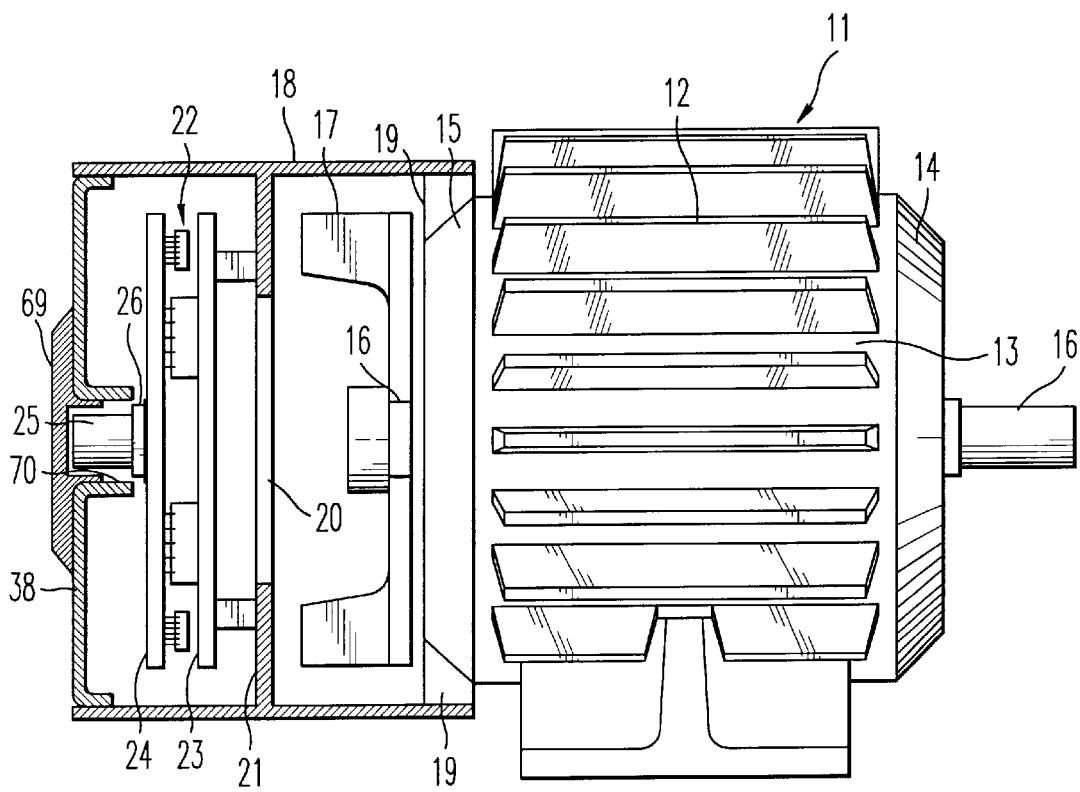
FIG. 34 is a lateral view of the whole motor showing a cross section of the control part as shown in the fourteenth embodiment of the present invention.

As FIG. 34 shows the fourteenth embodiment of the present invention, mention will only be made of parts differing from the first embodiment.

In the case of this embodiment, capacitor cover 69 is provided, this capacitor cap 69 is inserted into hole part 70 of protective cover 38 and covers the attached capacitor 25.

With this construction, it is possible to prevent human hands from coming into contact with capacitor 25 during normal motor operation. In particular, during normal motor operations, as capacitor 25 of the control device applies high voltage power, it is advisable not to leave capacitor 25 exposed from protective cover 38 even for the purpose of facilitating attachment and removal. Accordingly, as mentioned above, capacitor cover 69 covers capacitor 25 when aforementioned capacitor 25 is in an attached condition, in this way as it is possible to prevent human hands coming into contact with capacitor 25 during normal motor operations, handling precautions are not needed.

Figure 35:
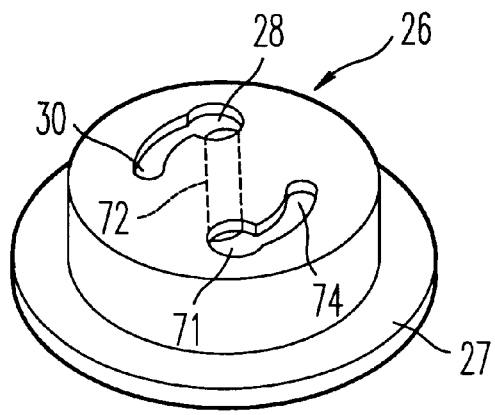
FIG. 35 is an oblique view of the mounting device as shown as the fifteenth embodiment of the present invention.
Figure 36:
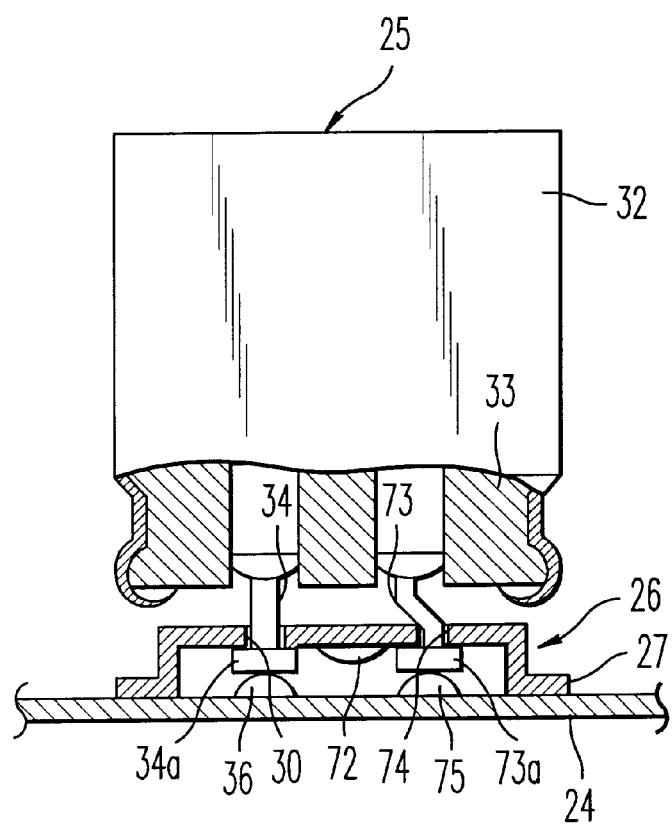
FIG. 36 is a broken plan view of the main part as shown as the fifteenth embodiment of the present invention.

As FIG. 35 and FIG. 36 show the fifteenth embodiment of the present invention, mention will only be made of parts differing from the first embodiment.

In the case of this embodiment, short circuit member 72 consisting of electric conductors is provided between hole 28, 71 of the mounting device so that a part of both edge parts overhang hole 28, 71.

As a result, from an attached condition, whereby connecting terminal 34, 73 of capacitor 25 is inserted from hole 28, 71 to elongated hole 30, 74, when removing capacitor 25 by rotating in the opposite direction, as flange part 34a, 73a of connecting terminal 34, 73 contacts with short circuit member 72, short circuit member 72 produces a short circuit between connecting terminals 34, 73.

Removal of capacitor 25 is generally carried out after waiting for capacitor 25 to finish discharging, however, should removal be carried out before discharging is completed, there is a danger that a spark may be produced between connecting point 36, 75 of the circuit board 24 and connecting terminals 34, 73. To counteract this, when removing capacitor 25 as mentioned above, the provision of short circuit member 72 which contacts with connecting terminal 34, 73 of capacitor 25 causes a short circuit between them, producing an electrical discharge between connecting terminals 34, 73, thereby stopping spark generation occurring between connecting point 36, 75 of circuit board 24.

Figure 37:
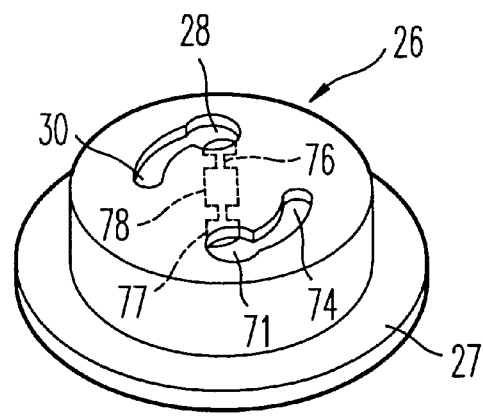
FIG. 37 is an oblique view of the mounting device as shown as the sixteenth embodiment of the present invention.
Figure 38:
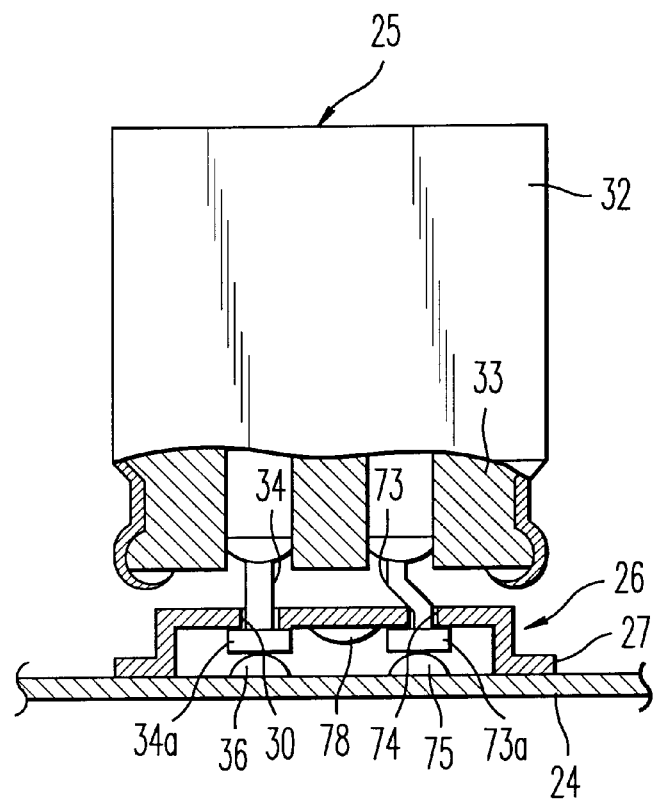
FIG. 38 is a broken plan view of the main part as shown as the sixteenth embodiment of the present invention.

As FIG. 37 and FIG. 38 show the sixteenth embodiment of the present invention, mention will only be made of parts differing from the first embodiment.

In the case of this embodiment, connecting member 76, 77 consisting of electrical conductors, is provided so that one part overhangs hole 28, 71 of the mounting part, in addition, the voltage reducing component, resistor 78 is provided connected between connecting member 76, 77.

Therefore, even in this embodiment, from the attached condition of capacitor 25, whereby connecting terminal 34, 73 is inserted from hole 28, 71 into elongated hole 30, 74, when removing capacitor 25 by rotating in the opposite direction, both flange 34a, 73a of connecting terminal 34, 73 make contact with connecting member 76, 77. As a result, the discharge between connecting terminal 34, 73 (preventing spark generation between connecting point 36, 75 of circuit board 24) occurs via resistor 78, whereby the reduction in voltage caused by the resistance results in a reduced electrical discharge flow between the above mentioned connecting terminals 34, 73.

Furthermore, diodes etc., may be used as a voltage reducing component in this case, in particular, by using a light emitting diode, the light emitting diode would emit light indicating the presence of electrical discharge when electrical discharge was occurring between connecting terminals 34, 73.

The above is an explanation of the present invention the effects of which are stated below. Namely, a motor with attached control device of the present invention wherein the attachment and removal of the capacitor of the control device which requires relatively frequent replacement can be performed freely, enabling the replacement to be performed simply.

Also, a motor with attached control device of the present invention wherein, the replacement of the capacitor of the control device can be performed simply and the attachment of the aforementioned capacitor can be performed without error in the polarity alignment.

Also, a motor with attached control device of the present invention wherein, the rotation operation when attaching or removing the capacitor of the control device can be performed simply and with certainty using a hexagonal wrench.

A motor with attached control device of the present invention wherein, the lifting operation when removing the capacitor of the control device can be performed simply and with certainty with the use of any type of screw.

A motor with attached control device of the present invention wherein, the rotation operation when attaching and removing the capacitor of the control device can be performed simply and with certainty by hand.

A motor with attached control device of the present invention wherein, the rotation operation when attaching or removing the capacitor of the control device can be performed simply and with certainty using a coin, etc.

A motor with attached control device of the present invention wherein, during normal motor operation is simplified as human hands are prevented from coming in contact with the capacitor of the control device.

A motor with attached control device of the present invention wherein, removal of the capacitor of the control device does not generate a spark between the corresponding contact points.

A motor with attached control device of the present invention wherein, removal of the capacitor of the control device does not generate a spark between the corresponding contact points and electrical discharge is reduced.

Obviously, numerous additional modifications are possible in light of the above teachings. It is therefore to be understood that within the scope of the appended claims, the invention may be practiced otherwise than as specially described herein.

What is claimed as new and desired to be secured by Letters Patent of the United States is:

1. A motor with attached control device comprising:
   a motor body;
   a control device for controlling a drive of said motor body;
   a capacitor connected to said control device;
   a mounting device attaching said capacitor to said motor;
   first and second connecting terminals provided on said capacitor; and
   a short circuit member on said mounting device, which comes into contact with said first and second connecting terminals producing a short circuit between said terminals;
   wherein:
   said capacitor attached to said mounting device is freely attachable to said mounting device and freely removable from said mounting device; and
   said first connecting terminal of said capacitor and said second connecting terminal of said capacitor are provided so that their distance from the center of said capacitor is different.

2. The motor with attached control device according to claim 1, wherein:
   said capacitor comprises first and second connecting terminals,
   a first line joining one of said connecting terminals of the said capacitor and an approximate center of said capacitor, and
   a second line joining said other connecting terminal and said approximate center of said capacitor intersect at a predetermined angle.

3. The motor with attached control device according to claim 1, wherein:
   said capacitor comprises first and second connecting terminals; and
   only said first terminal is concave in shape.

4. The motor with attached control device according to claim 1, wherein:
   said capacitor comprises first and second connecting terminals respectively connected to a screw cap base and a connecting node provided on a mounting part side of said capacitor.

5. The motor with attached control device according to claim 1, further comprising:
   a polygonal hole being provided in an apex of said capacitor.

6. The motor with attached control device according to claim 1, further comprising:
   a screw hole being provided in an apex of said capacitor.

7. The motor with attached control device according to claim 1, further comprising:
   a protruding part being provided in an apex of said capacitor.

8. The motor with attached control device according to claim 1, further comprising:
   a grooved part being provided in an apex of said capacitor.

9. The motor with attached control device according to claim 1, further comprising:
   a cover being provided on said mounting device, for covering said capacitor when in an attached condition.

10. The motor with attached control device according to claim 1, comprising:
    said mounting device solderlessly attaching said capacitor to said motor.

11. A motor with attached control device comprising:
    a motor body;
    a control device for controlling a drive of said motor body;
    a capacitor connected to said control device;
    a mounting device attaching said capacitor to said motor;
    first and second connecting terminals provided on said capacitor;
    connecting members being provided on said mounting device, said connecting members coming in contact with said connecting terminals, and
    a voltage reducing component being provided between said connecting members.

* * * * *